United States Patent
Liu et al.

(10) Patent No.: US 9,620,575 B2
(45) Date of Patent: Apr. 11, 2017

(54) DOUBLE-SIDED DISPLAY AND CONTROL METHOD THEREOF

(71) Applicant: SHENZHEN ROYOLE TECHNOLOGIES CO., LTD., Shenzhen (CN)

(72) Inventors: Zihong Liu, Shenzhen (CN); Xiaojun Yu, Shenzhen (CN)

(73) Assignee: Shenzhen Royole Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/697,277

(22) Filed: Apr. 27, 2015

(65) Prior Publication Data

US 2015/0295016 A1  Oct. 15, 2015

Related U.S. Application Data

(63) Continuation-in-part of application No. PCT/CN2012/084418, filed on Nov. 9, 2012.

(51) Int. Cl.
*H01L 27/32* (2006.01)
*G09G 3/20* (2006.01)
(Continued)

(52) U.S. Cl.
CPC ......... *H01L 27/3267* (2013.01); *G09G 3/001* (2013.01); *G09G 3/20* (2013.01); *G09G 3/3258* (2013.01); *G09G 3/344* (2013.01); *H01L 27/3232* (2013.01); *H01L 27/3262* (2013.01); *H01L 27/3265* (2013.01); *H01L 27/3288* (2013.01); *G09G 3/3233* (2013.01); (Continued)

(58) Field of Classification Search
None
See application file for complete search history.

(56) References Cited

U.S. PATENT DOCUMENTS

| | | |
|---|---|---|
| 2008/0122735 A1 | 5/2008 | Park et al. |
| 2011/0285610 A1* | 11/2011 | Yan ........................... G09G 3/20 345/55 |
| 2012/0162271 A1* | 6/2012 | Hsieh .................. H01L 27/3267 345/690 |

FOREIGN PATENT DOCUMENTS

| | | |
|---|---|---|
| CN | 1700828 | 11/2005 |
| CN | 101976544 | 2/2011 |
| CN | 102157545 | 8/2011 |

OTHER PUBLICATIONS

International Search Report of PCT/CN2012/084418, dated Aug. 22, 2013 and English translation thereof.

* cited by examiner

*Primary Examiner* — Nicholas Lee
(74) *Attorney, Agent, or Firm* — Hamre, Schumann, Mueller & Larson, P.C.

(57) ABSTRACT

A double-sided display and a method for controlling the same are provided. The double-sided display includes a plurality of pixel units and a plurality of circuits. The pixel units are disposed on each of a front side and a back side of the double-sided display, and the pixel units on the front side are opposite to the pixel units on the back side in a one-to-one manner. A pixel unit on the front side and a pixel unit on the back side opposite to the pixel unit on the front side are controlled by an identical circuit. Each of the circuits includes a switching transistor. The switching transistor includes a first input terminal connected to a scan line, a second input terminal connected to a data line, and an output terminal connected to the opposite pixel units on the front side and the back side.

18 Claims, 10 Drawing Sheets

(51) Int. Cl.
*G09G 3/34* (2006.01)
*G09G 3/00* (2006.01)
*G09G 3/3258* (2016.01)
*G09G 3/3233* (2016.01)

(52) U.S. Cl.
CPC ............... *G09G 2300/023* (2013.01); *G09G 2300/0465* (2013.01); *G09G 2300/0814* (2013.01); *G09G 2360/04* (2013.01)

DOUBLE-SIDED DISPLAY AND CONTROL METHOD THEREOF

CROSS REFERENCES OF RELATED APPLICATION

This application is a Continuation-In-Part of International Patent Application No. CN2012/084418, file on Nov. 9, 2012, which is hereby incorporated by reference in its entirety.

BACKGROUND OF THE DISCLOSURE

1. Technical Field

The present disclosure relates to the field of display technology, and more particularly, to a double-sided display and a control method thereof.

2. Description of Related Art

With the development of science and technology, double-sided displays have emerged. Document No. US 2008/0122735 A1 discloses a double-sided display. Individual pixel units for emitting light at two sides are all disposed on an identical glass substrate. Accordingly, the number of TFTs for the double-sided display is doubled, and double data scan lines and data scan driving ICs are required as compared to a conventional single-sided display, resulting in a large number of circuit lines, a complicated structure, a high cost, and a low aperture ratio of pixels.

BRIEF SUMMARY OF THE DISCLOSURE

An objective of embodiments of the present disclosure is to provide a double-sided display, so as to solve the problem that the conventional double-sided display has a large number of circuit lines and a complicated structure.

The embodiments of the present disclosure are accomplished as follows.

A double-sided display, includes a plurality of pixel units on both of a front side and a back side, and a plurality of circuits. The pixel units on the front side are opposite to the pixel units on the back side in a one-to-one manner. The pixel units opposite each other on the front side and the back side are controlled by an identical circuit. Each of the circuit includes a first switching transistor. A first input terminal of the first switching transistor is connected to a scan line, and a second input terminal is connected to a data line. The pixel units opposite each other on the front side and the back side are electrically connected to an output terminal of the first switching transistor.

In the embodiments of the present disclosure, the scan line and the data line are respectively connected to the first input terminal and the second input terminal of the first switching transistor, and the pixel units opposite each other on the front side and the back side are connected to the output terminal of the first switching transistor, therefore, a control of dual display is achieved by sharing an identical switching transistor. In this way, a small number of circuit lines are required, the structure is simple, the aperture ratio of the pixels is high, and the cost of the double-sided display is relatively reduced.

DETAILED DESCRIPTION OF THE DISCLOSURE

Figure 1:
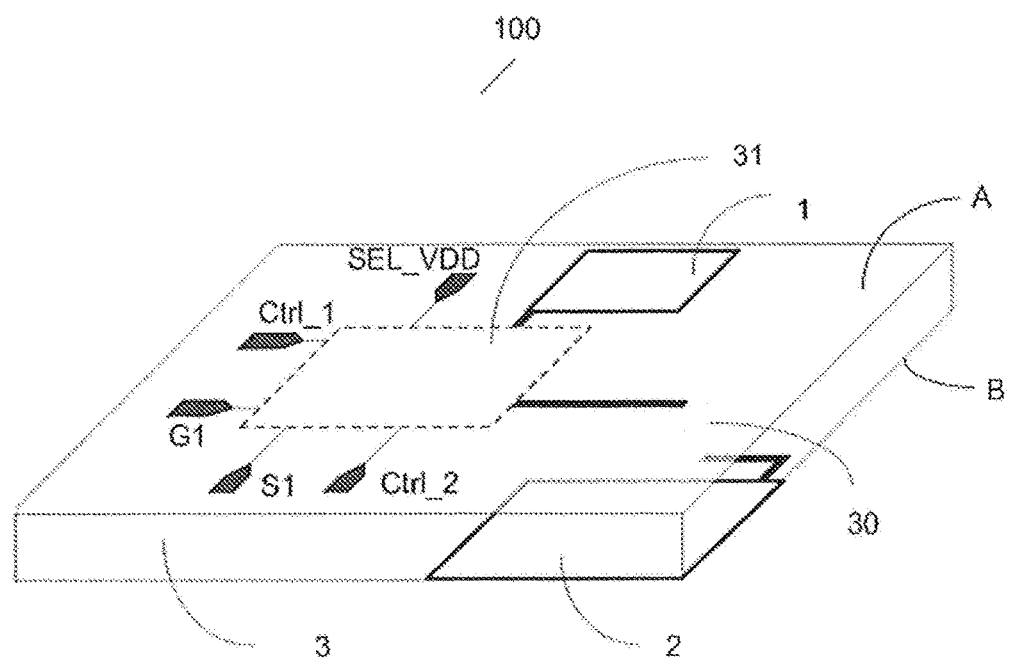
FIG. 1 is a schematic structural view of opposite pixel units on a front side and a back side in a double-sided display according to an embodiment of the present disclosure (the pixel unit on the front side is an active light-emitting display unit)
Figure 2:
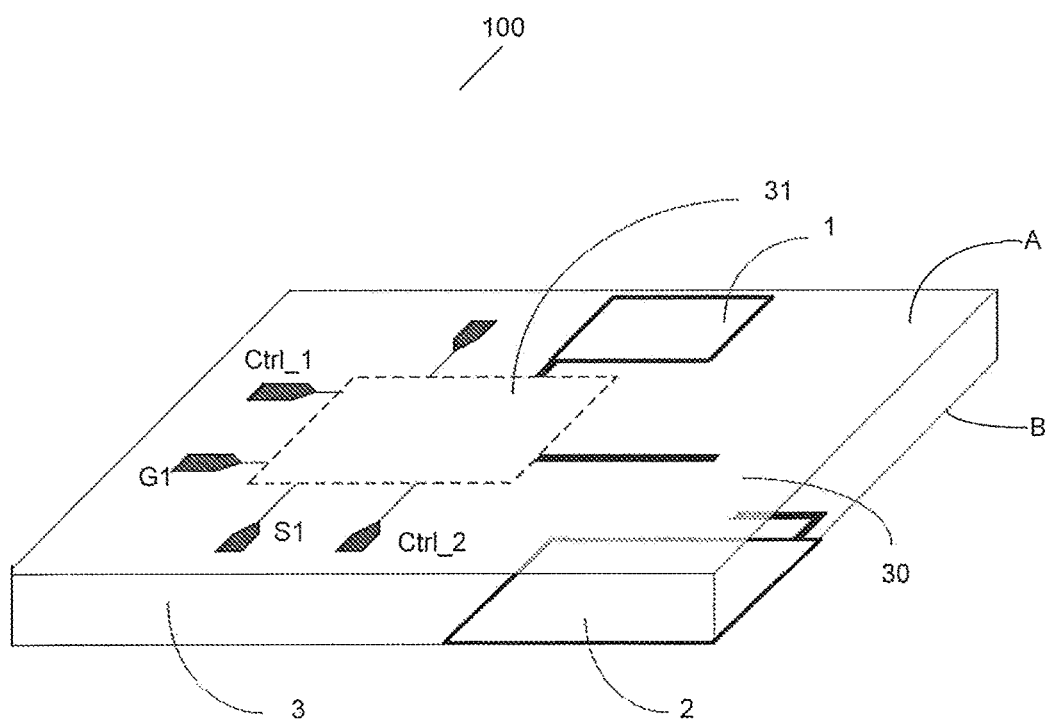
FIG. 2 is another schematic structural view of opposite pixel units on a front side and a back side in a double-sided display according to an embodiment of the present disclosure (the pixel unit on the front side is a passive light-emitting display unit)
Figure 3:
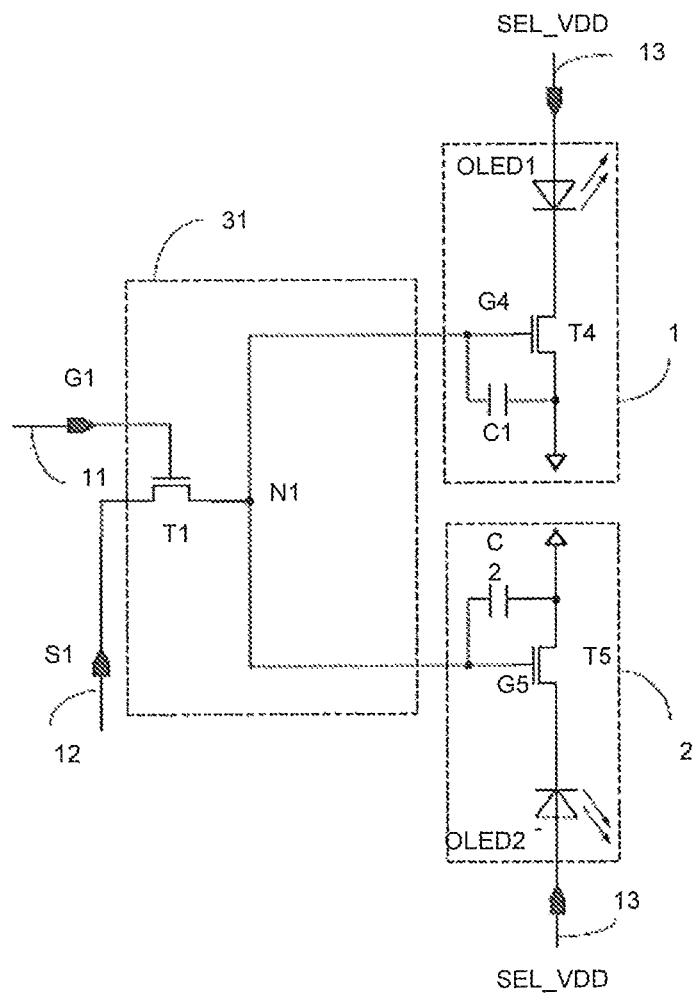
FIG. 3 is an equivalent circuit diagram of a display module of a double-sided display according to Embodiment 1 of the present disclosure (both the pixel unit on a front side and the pixel unit on a back side are active light-emitting display units)

To enable objectives, technical solutions and advantages of the present disclosure to be understood more clearly, the present disclosure will be further detailed described with reference to attached drawings and embodiments thereof hereinafter. It shall be appreciated that, the embodiments described herein are only intended to illustrate but not to limit the present disclosure.

In the embodiments of the present disclosure, a scan line and a data line are respectively connected to a first input terminal and a second input terminal of a first switching transistor T1, and a pixel unit on a front side and a pixel unit on a back side opposite to the pixel unit on the front side of a double-sided display are both connected to an output terminal of the first switching transistor T1, and thus, a control of a dual display is achieved by making every two opposite pixel units share an identical switching transistor. In this way, a small number of circuit lines are required, the structure is simple, and the cost of the double-sided display is relatively reduced.

Hereinafter, several embodiments are listed to describe the implementation of the present disclosure in detail.

Embodiment 1

As shown in FIGS. 1~5, each of a front side A and a back side B of a double-sided display 100 according to this embodiment of the present disclosure includes a plurality of pixel units, and the pixel units on the front side A are opposite to the pixel units on the back side B in a one-to-one manner. Each of the pixel units on the front side A may be directly opposite to a corresponding pixel unit on the back side B, for example. For convenience of description, here a pixel unit 1 on the front side A and an opposite pixel unit 2 on the back side B are taken as an example for description. In this embodiment, the pixel unit 1 on the front side A and the opposite pixel unit 2 on the back side B are controlled by an identical circuit 31. The circuit 31 comprises a first switching transistor T1. The opposite pixel units 1, 2 on the front side A and on the back side B, and the circuit 31 cooperatively form a display module. The first switching transistor T1 may be an N-type thin film transistor or a P-type thin film transistor, for example. Here, the N-type thin film transistor is adopted. A first input terminal of the first switching transistor T1 is connected to a scan line 11, and the scan line 11 extends along a row direction in this embodiment. The second input terminal of the first switching transistor T1 is connected to a data line 12, and the data line 12 extends along a column direction in this embodiment. The opposite pixel units 1, 2 on the front side A and the back side B are electrically connected to an output terminal of the first switching transistor T1. A node N1 is defined between the pixel unit 1 and the output terminal of the first switching transistor T1. The pixel unit 2 is connected to the node N1. In this way, the number of the scan lines 11 and the data lines 12 in this double-sided display 100 is the same as that of a conventional single-sided display. Therefore, as compared to the conventional single-sided display, the double-sided display 100 of the present disclosure has a smaller number of circuit lines and may be designed and manufactured more easily, and the cost of the double-side display 100 is relatively reduced. Further, the aperture ratio and the light-emitting efficiency of the double-sided display 100 of the present disclosure are improved. Additionally, the double-sided display 100 of the present disclosure is implemented by leading the output terminal of the first switching transistor T1 to the pixel unit 2 on the back side B, and thus, the structure of the double-sided display 100 becomes simple.

The circuit 31 is disposed on a thin film transistor (MT) backplate 3 having a plurality of through holes 30 penetrating through the TFT backplate 3, and the output terminal of the first switching transistor T1 is connected to the pixel unit 2 on the back side B via a through hole 30. The through holes 30 are filled with electrical connections. The output terminal of the first switching transistor T1 is electrically connected to the pixel unit 2 on the back side B via one of the electrical connections. In this way, the pixel unit 1 on the front side A and the pixel unit 2 on the back side B are connected to the output terminal of the first switching transistor T1 in parallel. The pixel unit 1 and the pixel unit 2 are simultaneously switched on or switched off via sharing the identical first switching transistor T1 and accordingly display identical images simultaneously. The double-sided display 100 is mainly used to display advertisements on the front and back sides A, B. The pixel unit 1 on the front side A may be an active light-emitting display unit or passive light-emitting display unit, the pixel unit 2 on the back side may be an active light-emitting display unit or passive light-emitting display unit, and each of the pixel units 1 and 2 on the front and back sides A, B includes a storage capacitor.

Now, an organic light-emitting diode OLED acting as an active light-emitting display device and an electronic ink E-INK acting as a passive light-emitting display device are respectively taken as an example for description. The double-sided display 100 shown in FIG. 3 adopts active light-emitting display units on both of the front side A and the back side B. The active light-emitting display unit on the front side A of the double-sided display 100 includes an OLED1 acting as an active light-emitting display device and a first driving transistor T4. The first driving transistor T4 includes a control terminal electrically connected to the output terminal of the first switching transistor T1, an input terminal electrically connected to a cathode of the OLED1, and an output terminal grounded. A storage capacitor C1 is connected between the control terminal and the output terminal of the first driving transistor T4, and an anode of the OLED1 is connected to a power supply line 13. Moreover, a power supply SEL_VDD input from the power supply line 13 is automatically switched to a voltage 0V (Volt) or a voltage VDD under control of a peripheral driving control chip (not shown), according to a working state of each side of the double-sided display 100.

Similarly, the active light-emitting display unit on the back side B of the double-sided display 100 further includes an OLED2 acting as an active light-emitting display device and a second driving transistor T5. The second driving transistor T5 includes a control terminal electrically connected to the output terminal of the first switching transistor T1, an input terminal electrically connected to a cathode of the OLED2, and an output terminal grounded. A storage capacitor C2 is connected between the control terminal and the output terminal of the second driving transistor T5, and an anode of the OLED2 is connected to the same power supply line 13.

In the embodiment, the second driving transistor T5 and the storage capacitor C2 are both disposed on the back side B. However, in alternative embodiments, the second driving transistor T5 and the storage capacitor C2 are disposed on the front side A instead of the back side B, so as to simplify manufacturing process of display panel, improve the aperture ratio of the back side B and reduce the thickness of the double-sided display 100. In detail, the output terminal of the second driving transistor T5 is connected to the cathode of the OLED2 via the through hole 30. That is, the pixel unit 2 on the back side B mainly indicates the OLED2, and further includes the second driving transistor T5 and the storage capacitor C2 disposed on the front side A.

Furthermore, in alternative embodiments, the circuit 31 is disposed on the back side instead of the front side A. Moreover, the first driving transistor T4 and the storage capacitor C1 are disposed on the same side with the circuit 31 and the pixel unit 2 instead of the front side A. Accordingly, the aperture ratio of the front side is improved because only OLED1 is disposed.

Figure 4:
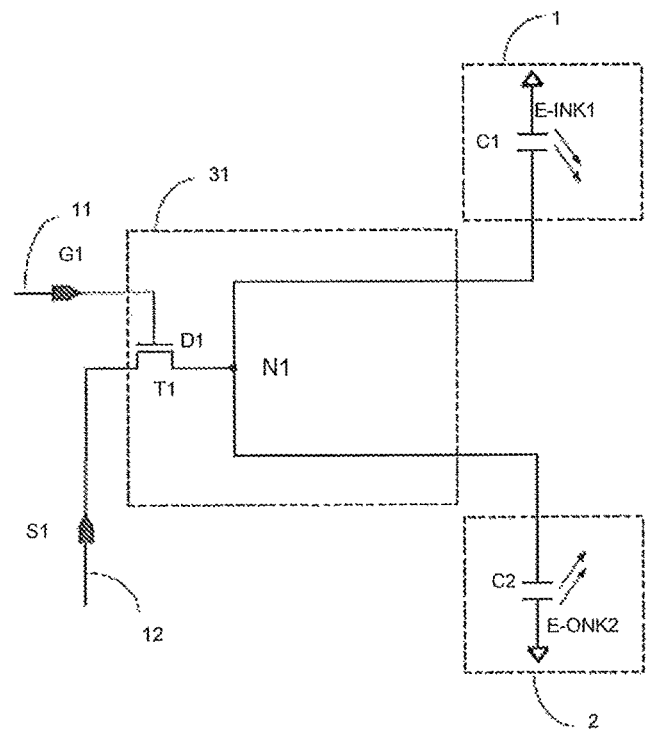
FIG. 4 is an equivalent circuit diagram of a display module of a double-sided display according to Embodiment 1 of the present disclosure (both the pixel unit on a front side and the pixel unit on a back side are passive light-emitting display units)

The double-sided display 100 shown in FIG. 4 adopts passive light-emitting display units on both of the front side A and the back side B. The passive light-emitting display unit on the front side A of the double-sided display 100 includes E-INK1 acting as a passive light-emitting display device, and the E-INK1 is disposed between two counter electrodes of the storage capacitor C1. One of the two counter electrodes of the storage capacitor C1 is electrically connected to the output terminal of the first switching transistor T1, and the other is grounded.

Similarly, the passive light-emitting display unit on the back side B of the double-sided display includes E-INK2 acting as a passive light-emitting display device, and the E-INK2 is disposed between two counter electrodes of the storage capacitor C2. One of the two counter electrodes of the storage capacitor C2 is electrically connected to the output terminal of the first switching transistor T1 via the node N1, and the other is grounded.

Figure 5:
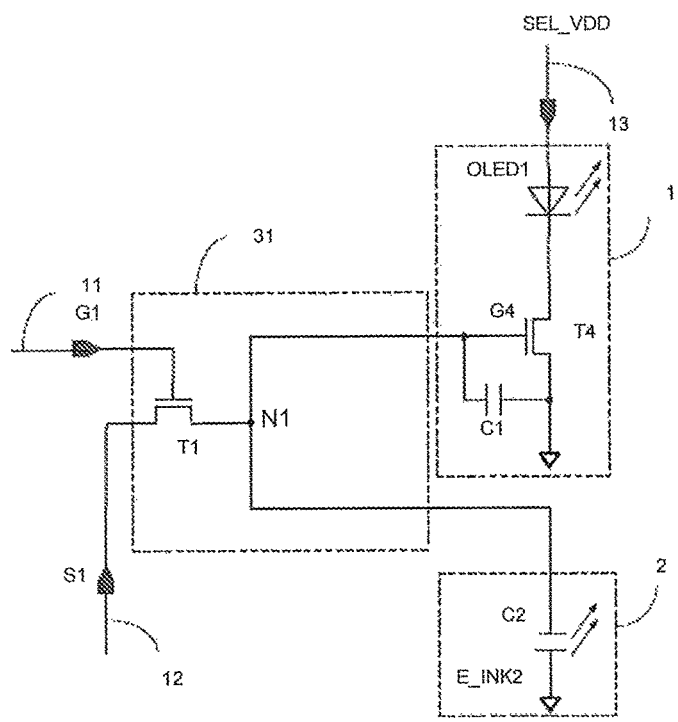
FIG. 5 is an equivalent circuit diagram of a display module of a double-sided display according to Embodiment 1 of the present disclosure (the pixel unit on a front side is an active light-emitting display unit and the pixel unit on a back side is a passive light-emitting display unit)

The double-sided display 100 shown in FIG. 5 adopts active light-emitting display units on the front side A and passive light-emitting display units on the back side B. The active light-emitting display unit on the front side A of the double-sided display includes the OLED1 acting as an active light-emitting display device and the first driving transistor T4. The first driving transistor T4 includes a control terminal electrically connected to the output terminal of the first switching transistor T1, an input terminal electrically connected to a cathode of the OLED1, and an output terminal grounded. The storage capacitor C1 is connected between the control terminal and the output terminal of the first driving transistor T4, and an anode of the OLED1 is connected to the power supply line 13.

Similarly, the passive light-emitting display unit on the back side B of the double-sided display 100 includes E-INK2 acting as a passive light-emitting display device, and the E-INK2 is disposed between two counter electrodes of the storage capacitor C2. One of the two counter electrodes of the storage capacitor C2 is electrically connected to the output terminal of the first switching transistor T1, and the other is grounded.

It should be understood that, if the double-sided display 100 adopts passive light-emitting display units on one of the front side A and the back side B, and active light-emitting display units on the other one of the front side A and the back side B, the effect of the double-sided display 100 are the same as those described above and thus will not be further described. In this way, the active light-emitting display (e.g., OLED) and the passive light-emitting play (e.g., E-INK) are included in the double-sided display 100. Therefore, the double-sided display 100 may be achieved with the optimized power-saving mode in any light environment. The passive light-emitting display (e.g., electronic ink E-INK) is used in the sun, while the active light-emitting display (e.g., organic light-emitting diode OLED) is used at night or in the dark environment.

It should be illustrated that, in this embodiment, a gate electrode G1 of the first switching transistor T1 acts as the first input terminal, a source electrode S1 of the first switching transistor T1 acts as the second input terminal, and a drain electrode D1 of the first switching transistor T1 acts as the output terminal. A gate electrode G4 of the first driving transistor T4 acts as the control terminal, a source electrode S4 of the first driving transistor T4 acts as the input terminal, and a drain electrode D4 of the first driving transistor T4 acts as the output terminal. A gate electrode G5 of the second driving transistor T5 acts as the control terminal, a source electrode S5 of the second driving transistor T5 acts as the input terminal, and a drain electrode D5 of the second driving transistor T5 acts as the output terminal.

Embodiment 2

Figure 6:
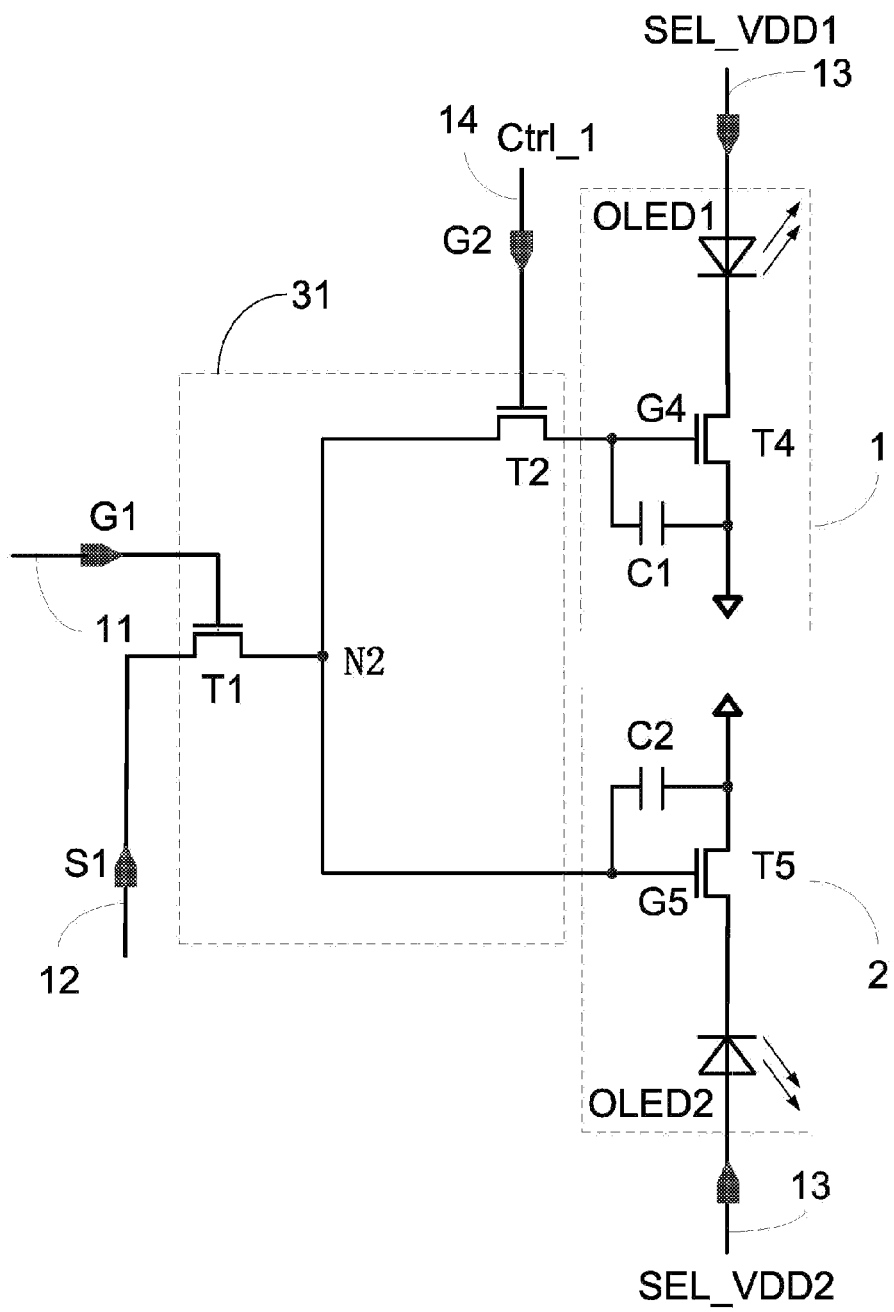
FIG. 6 is an equivalent circuit diagram of a display module of a double-sided display according to Embodiment 2 of the present disclosure (both the pixel unit on a front side and the pixel unit on a back side are active light-emitting display units)
Figure 7:
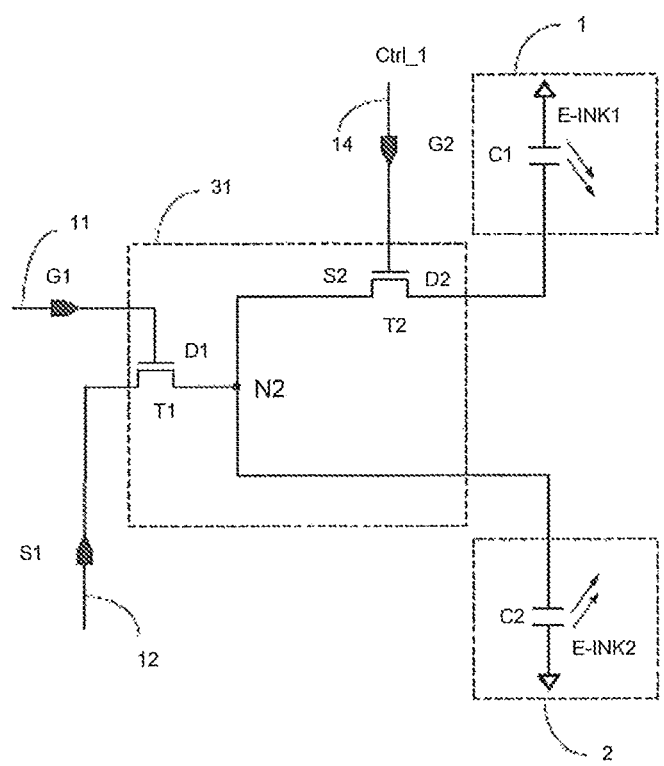
FIG. 7 is an equivalent circuit diagram of a display module of a double-sided display according to Embodiment 2 of the present disclosure (both the pixel unit on a front side and the pixel unit on a back side are passive light-emitting display units)

This embodiment differs from Embodiment 1 in that, a second switching transistor T2 for switching on the pixel unit 1 on the front side A is disposed between the output terminal of the first switching transistor T1 and the pixel unit 1 on the front side A. The second switching transistor T2 includes an input terminal electrically connected to the output terminal of the first switching transistor T1, an output terminal electrically connected to the pixel unit 1 on the front side A, and a control terminal connected to a control line 14, as shown in FIG. 6 and FIG. 7. A node N2 is defined between the output terminal of the first switching transistor T1 and the input terminal of the second switching transistor T2. The second driving transistor T5 is connected to the node N2. In this way, all the pixel units 1 on the front side A may be controlled to be switched on by connecting the control terminal of each second switching transistor T2 to the same control line 14 in this double-sided display 100, and one additional control line 14 is added. As compared to the conventional double-sided display, the double-sided display 100 of the disclosure has a small number of circuit lines and a simple layout.

A gate electrode G2 of the second switching transistor T2 acts as the control terminal, a source electrode S2 of the second switching transistor T2 acts as the input terminal, and a drain electrode D2 of the second switching transistor T2 acts as the output terminal. Once the double-sided display 100 is activated, the pixel unit 2 on the back side B of the double-sided display 100 emits light and displays images, while the front side A selectively emits light and displays images depending on practical situations. The switch-on of the front side A is controlled by a control signal Ctrl_1 input into the control line 14. In this way, the back side B of the double-sided display 100 may be used as the frequently-used display side, and the front side A thereof can be used as the auxiliary display side, which increases the flexibility of use for the double-sided display 100.

Further, in the embodiment of FIG. 6, the second driving transistor T5 and the storage capacitor C2 are both disposed on the back side B. However, in alternative embodiments, the second driving transistor T5 and the storage capacitor C2 are disposed on the front side A instead of the back side B, so as to simplify manufacturing process of display panel, improve the aperture ratio of the back side B and reduce the thickness of the double-sided display 100. In detail, the output terminal of the second driving transistor T5 is connected to the cathode of the OLED2 via the through hole 30.

Embodiment 3

Figure 8:
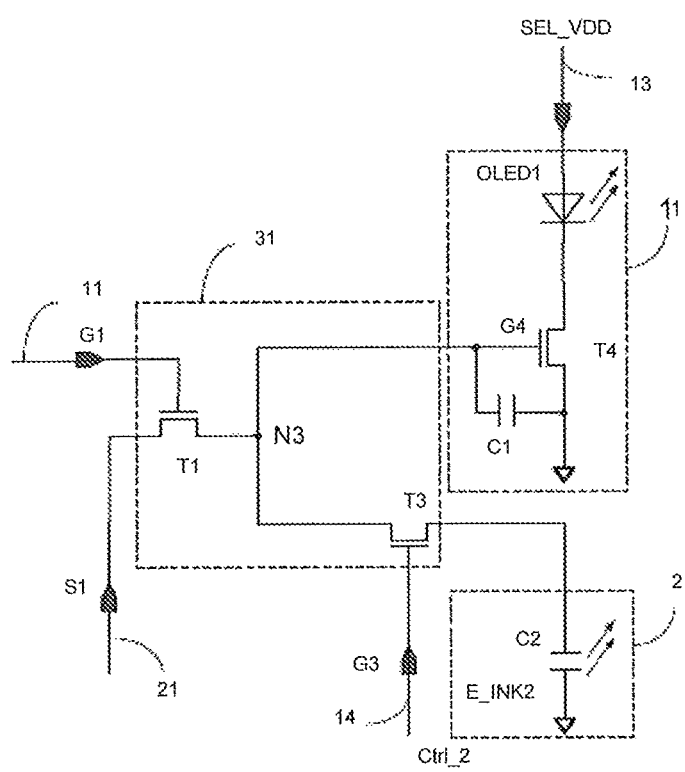
FIG. 8 is an equivalent circuit diagram of a display module of a double-sided display according to Embodiment 3 of the present disclosure (the pixel unit on a front side is an active light-emitting display unit and the pixel unit on a back side is a passive light-emitting display unit)

This embodiment differs from the Embodiment 1 and the Embodiment 2 in that, a third switching transistor T3 for switching on the pixel unit 2 on the back side B is disposed between the output terminal of the first switching transistor T1 and the pixel unit 2 on the back side B. The third switching transistor T3 includes an input terminal electrically connected to the output terminal of the first switching transistor T1, an output terminal electrically connected to one of the two counter electrodes of the storage capacitor C2 of the pixel unit 2 of the E-INK2 on the back side B, and a control terminal connected to the control line 14, as shown in FIG. 8. A node N3 is defined between the output terminal of the first switching transistor T1 and the input terminal of the third switching transistor T3. The control terminal of the first driving transistor T4 is connected to the node N3. In this way, all the pixel units 2 on the back side B may be controlled to be switched on by connecting the control terminal of each third switching transistor T3 to the same control line 14 in the double-sided display 100, and one additional control line 14 is added. As compared to the conventional double-sided display, the double-sided display 100 has a small number of circuit lines and a simple layout.

A gate electrode G3 of the third switching transistor T3 acts as the control terminal, a source electrode S3 of the third switching transistor T3 acts as the input terminal, and a drain electrode D3 of the third switching transistor T3 acts as the output terminal. Once the double-sided display 100 is activated, the pixel unit 1 on the front side A of the double-sided display emits light and displays images, while the back side B selectively emits light and displays images depending on practical situations. The switch-on of the back side B is controlled by a control signal Ctrl_2 input into the control line 14. In this way, the front side A of the double-sided display 100 may be used as the frequently-used display side, and the back side B may be used as the auxiliary display side, which increases the flexibility of use for the double-sided display 100.

Embodiment 4

Figure 9:
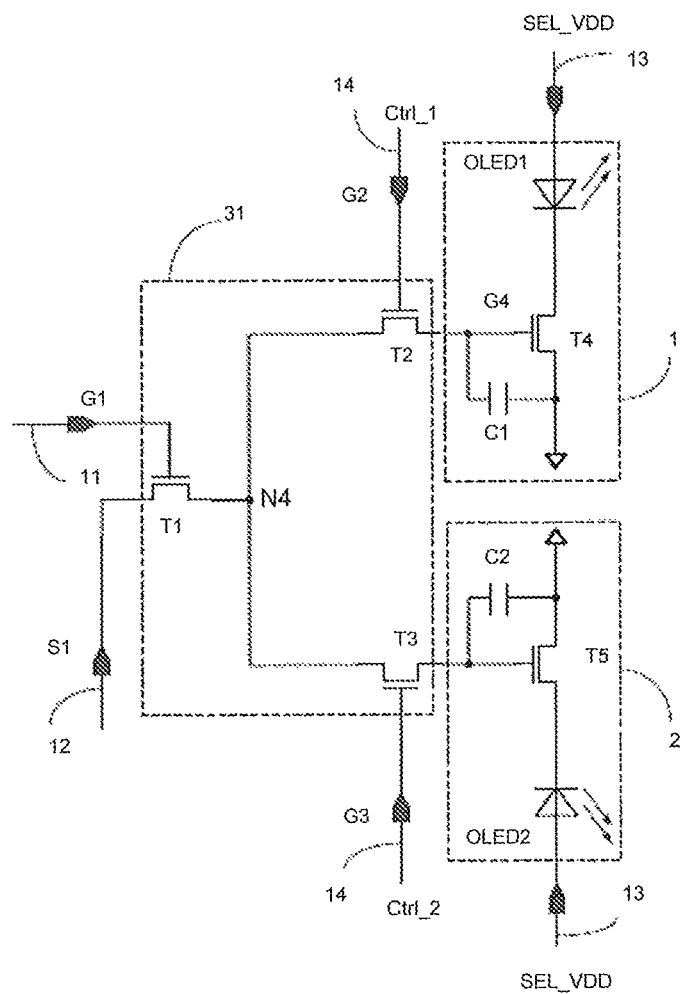
FIG. 9 is an equivalent circuit diagram of a display module of a double-sided display according to Embodiment 4 of the present disclosure (both the pixel unit on a front side and the pixel unit on a back side are active light-emitting display units)
Figure 10:
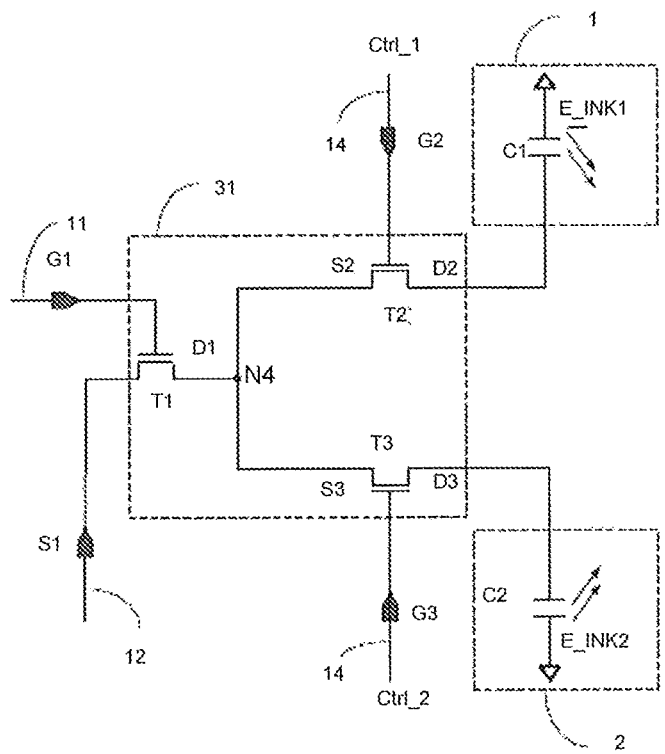
FIG. 10 is an equivalent circuit diagram of a display module of a double-sided display according to Embodiment 4 of the present disclosure (both the pixel unit on a front side and the pixel unit on a back side are passive light-emitting display units)
Figure 11:
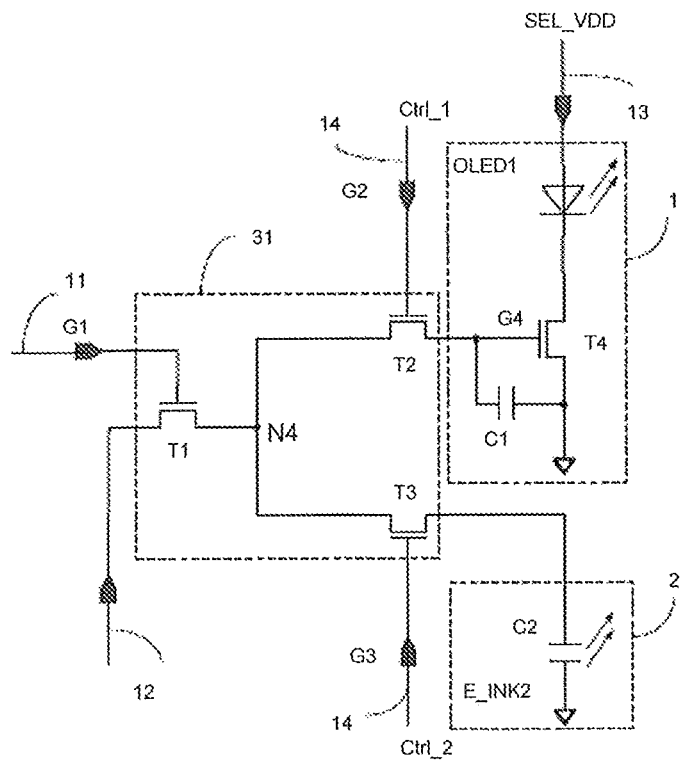
FIG. 11 is an equivalent circuit diagram of a display module of a double-sided display according to Embodiment 4 of the present disclosure (the pixel unit on a front side is an active light-emitting display unit and the pixel unit on a back side is a passive light-emitting display unit)

This embodiment differs from the aforesaid embodiments in that, the second switching transistor T2 for switching on the pixel unit 1 on the front side A is disposed between the output terminal of the first switching transistor T1 and the pixel unit 1 on the front side A, and the third switching transistor T3 for switching on the pixel unit 2 on the back side B is disposed between the output terminal of the first switching transistor T1 and the pixel unit 2 on the back side B. The second switching transistor T2 includes an input terminal electrically connected to the output terminal of the first switching transistor T1, an output terminal electrically connected to the pixel unit 1 on the front side A, and a control terminal connected to the control line 14. The third switching transistor T3 includes an input terminal electrically connected to the output terminal of the first switching transistor T1, an output terminal electrically connected to the pixel unit 2 on the back side B, and a control terminal connected to the control line 14, as shown in FIGS. 9~11. A node N4 is defined between the output terminal of the first switching transistor T1 and the input terminal of the second switching transistor T2. The input terminal of the third switching transistor T3 is connected to the node N4.

In this way, all the pixel units 1 on the front side A and the pixel units 2 on the back side B may be controlled to be switched on by connecting the control terminal of each second switching transistor T2 and each third switching transistor T3 to the same control line 14 in the double-sided display 100, so that the front side A and the back side B of the double-sided display 100 simultaneously display the same images, and one additional control line 14 is added. As compared to the conventional double-sided display, the double-sided display 100 of the disclosure has a small number of circuit lines and a simple layout.

Further, in the embodiment of FIG. 9, the second driving transistor T5 and the storage capacitor C2 are both disposed on the back side B. However, in alternative embodiments, the second driving transistor T5 and the storage capacitor C2 are disposed on the front side A instead of the back side B, so as to simplify manufacturing process of display panel, improve the aperture ratio of the back side B and reduce the thickness of the double-sided display 100. In detail, the output terminal of the second driving transistor T5 is connected to the cathode of the OLED2 via the through hole 30.

Embodiment 5

Figure 12:
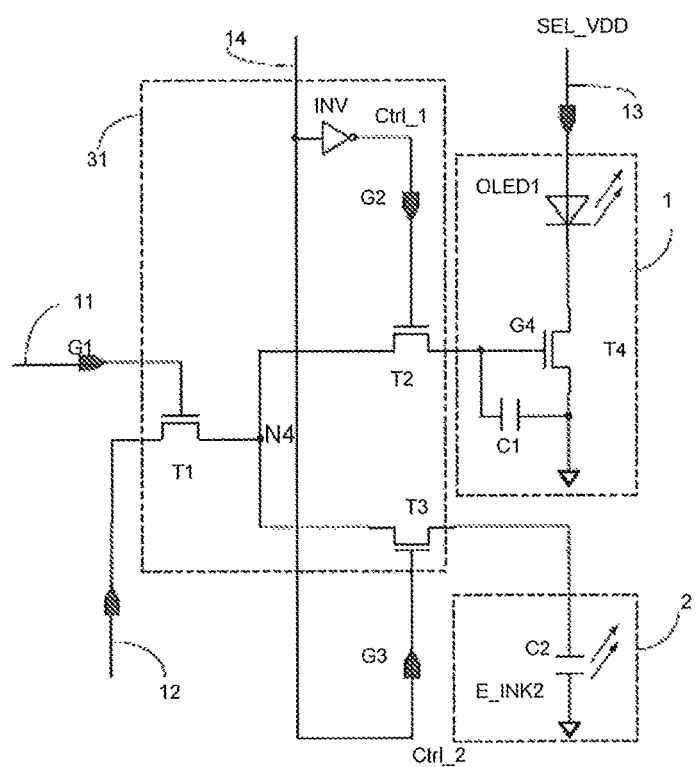
FIG. 12 is an equivalent circuit diagram of a display module of a double-sided display according to Embodiment 5 of the present disclosure (the pixel unit on a front side is an active light-emitting display unit and the pixel unit on a back side is a passive light-emitting display unit)
Figure 13:
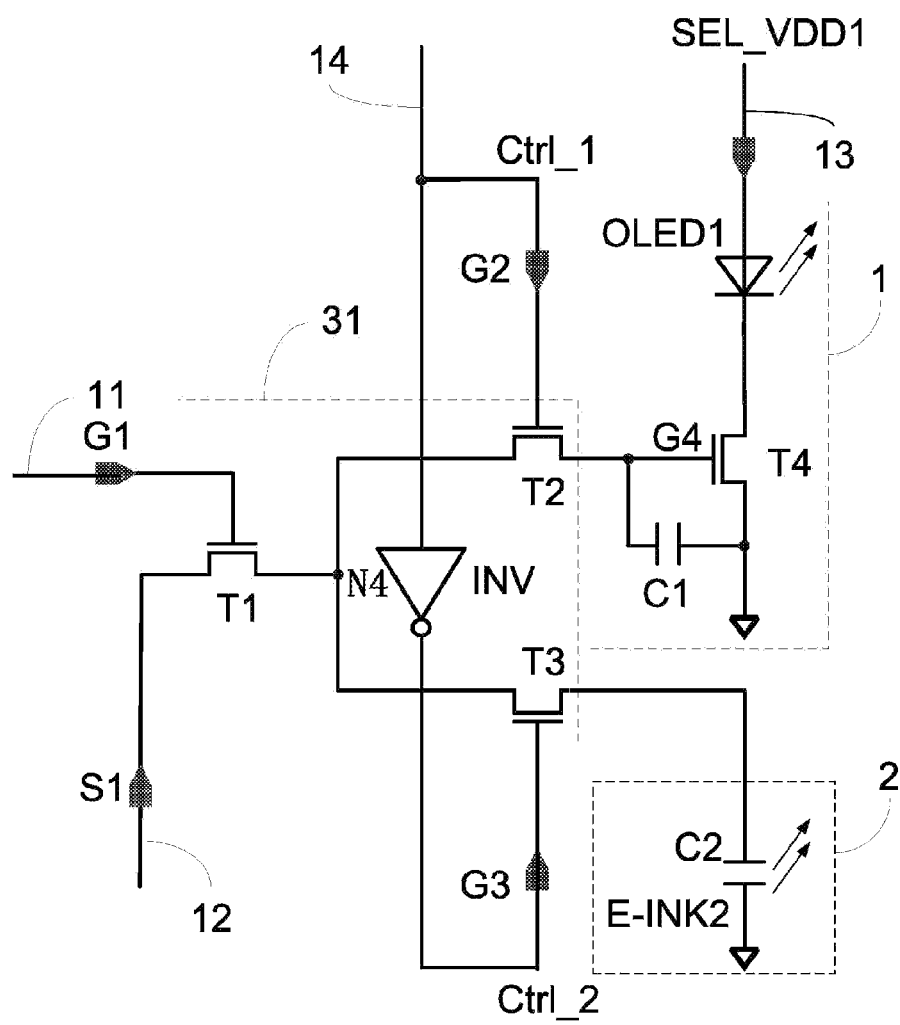
FIG. 13 is an equivalent circuit diagram of the display module of the double-sided display according to Embodiment 5 of the present disclosure (the pixel unit on a front side is an active light-emitting display unit and the pixel unit on a back side is a passive light-emitting display unit).

To make the front side A and the back side B of the double-sided display 100 not display simultaneously (e.g., the front side A displays images but the back side B does not display images, or the back side B displays images but the front side A does not display image, i.e., only one side displays images), or to make the front side A and the back side B display different images at the same time for example, an inverter INV is connected between the control terminal of the second switching transistor T2 and the control terminal of the third switching transistor T3, and then the same control line 14 is connected. For example, as shown in FIG. 12, the control terminal of the second switching transistor T2 is connected to an output terminal of the inverter INV. An input terminal of the inverter INV and the control terminal of the third switching transistor T3 are connected to the same control line 14. As another example, as shown in FIG. 13, the control terminal of the third switching transistor T3 is connected to an output terminal of the inverter INV. The input terminal of the inverter INV and the control terminal of the second switching transistor T2 are connected to the same control line 14.

If a control signal Ctrl_1="1" of a high potential for switching on the second switching transistor T2 is input into the control line 14, and a power supply SEL_VDD input into the power supply line 13 is automatically switched to the voltage VDD. The control signal Ctrl_1="1" becomes a control signal Ctrl_2="0" of a low potential for switching off the third switching transistor T3, after passing through the inverter INV. Accordingly, the second switching transistor T2 is switched on, the third switching transistor T3 is switched off, and the pixel unit 1 on the front side A is controlled by a scan signal to the gate electrode G1 and a data signal to the source electrode S1 of the first switching transistor T1. Correspondingly, only the front side A displays images.

If a control signal Ctrl_1="0" of a low potential for switching off the second switching transistor T2 is input into the control line 14, and the power supply SEL_VDD input into the power supply line 13 is automatically switched to the voltage 0V. The control signal Ctrl_1="0" becomes a control signal Ctrl_2="1" of a high potential for switching on the third switching transistor T3, after passing through the inverter INV. Accordingly, the second switching transistor T2 is switched off, the third switching transistor T3 is switched on, and the pixel unit 2 on the back side B is controlled by the scan signal to the gate electrode G1 and the data signal to the source electrode S1 of first switching transistor T1. Correspondingly, only the back side B displays images.

If the control signal Ctrl_1="1" of a high potential for switching on the second switching transistor T2 is firstly input into the control line 14, and the control signal Ctrl_="1" becomes the control signal Ctrl_2="0" of a low potential for switching off the third switching transistor T3 after passing through the inverter INV. Accordingly, the second switching transistor T2 is switched on, the third switching transistor T3 is switched off, and the pixel unit 1 on the front side A is driven by a first data signal input via the activated first switching transistor T1. That is, the front side A of the double-sided display 100 displays an image that is driven by the first data signal. Meanwhile, the first data signal charges the storage capacitor C1 of the pixel unit 1 on the front side A until a voltage of the storage capacitor C1 of the pixel unit 1 on the front side A reaches a voltage required for maintaining the display of the pixel unit 1 on the front side A.

Next, the control signal Ctrl_1="0" of a low potential for switching off the second switching transistor T2 is input into the control line 14, and the control signal Ctrl_1="0" becomes the control signal Ctrl_2="1" of a high potential for turning on the third switching transistor T3 after passing through the inverter INV. Accordingly, the second switching transistor T2 is switched off, the third switching transistor T3 is switched on, and the pixel unit 2 on the back side B is driven by a second data signal via the activated first switching transistor T1. That is, the back side B of the double-sided display 100 displays an image that is driven by the second data signal. Meanwhile, the second data signal charges the storage capacitor C2 of the pixel unit 2 on the back side B until a voltage of the storage capacitor C2 of the pixel unit 2 on the back side B reaches a voltage required for maintaining the display of the pixel unit 2 on the back side B. When the back side B of the double-sided display 100 displays images, the front side A thereof maintains the originally displayed images until the second switching transistor T2 is switched on during the next period due to an existence of the storage capacitor C2. Similarly, when the front side A of the double-sided display 100 displays images, the back side B thereof maintains the originally displayed images until the third switching transistor T3 is switched on during the next period.

In this embodiment, the first data signal, after being input from the data line 12, is transmitted to the pixel unit 1 on the front side A via the first switching transistor T1 and the second switching transistor T2 in sequence. The second data signal, after being input from the second scan line 12, is transmitted to the pixel unit 2 on the back side B via the first switching transistor T1 and the third switching transistor T3 in sequence. The first data signal and the second data signal are different image signals and are alternately transmitted to the pixel unit 1 on the front side A and the pixel unit 2 on the back side B in a time division manner. In this way, the double-sided display 100 may firstly display an image on the front side A and then display another image on the back side B, and then this display process is cycled until the front side A and the back side B simultaneously display different images changing continuously.

Alternatively, the double-sided display 100 may alternately display rows (columns) of an image on the front side A and rows (columns) of another image on the back side B, until the front side A and the back side B each displays a complete image, and then this display process is cycled until the front side A and the back side B simultaneously display different images changing continuously. In this way, the front side A and the back side B of the double-sided display 100 may simultaneously display different images and this is particularly suitable for outdoors advertisement exhibition. Of course, if the first data signal and the second data signal are identical image signals, the front side A and the back side B of the double-sided display 100 may simultaneously display identical images.

What described above are only the preferred embodiments of the present disclosure, and are not intended to limit the present disclosure. Any modifications, equivalent replacements and improvements made within the spirit and the principle of the present disclosure shall all be covered within the claimed scope of the present disclosure.

The invention claimed is:

1. A double-sided display, comprising:
   a plurality of pixel units on each of a front side and a back side of the double-sided display, the pixel units on the front side being opposite to the pixel units on the back side in a one-to-one manner;
   a plurality of circuits, wherein a pixel unit on the front side and a pixel unit on the back side opposite to the pixel unit on the front side are controlled by an identical circuit, and each of the circuits comprises a first switching transistor, a first input terminal of the first switching transistor connected to a scan line, a second input terminal of the first switching transistor connected to a data line, and an output terminal of the first switching transistor connected to the opposite pixel units on the front side and the back side; and
   a thin film transistor backplate having a plurality of through holes penetrating through the thin film transistor backplate, wherein the circuits are disposed on a same side of the thin film transistor backplate, and output terminals of first switching transistors of the circuits are respectively connected to the pixel units on the back side via the through holes.

2. The double-sided display of claim 1, wherein each of the circuit further comprises a second switch transistor; the second switching transistor for switching on the pixel unit on the front side is connected between the output terminal of the first switching transistor and the pixel unit on the front side; the second switching transistor comprises an input terminal electrically connected to the output terminal of the first switching transistor, an output terminal electrically connected to the pixel unit on the front side, and a control terminal connected to a control line.

3. The double-sided display of claim 2, wherein the first switching transistor comprises a gate electrode acting as the first input terminal, a source electrode acting as the second input terminal, and a drain electrode acting as the output terminal; the second switching transistor comprises a gate electrode acting as the control terminal, a source electrode acting as the input terminal, and a drain electrode acting as the output terminal.

4. A double-sided display, comprising:
   a plurality of pixel units on each of a front side and a back side of the double-sided display, the pixel units on the front side being opposite to the pixel units on the back side in a one-to-one manner; and
   a plurality of circuits, wherein a pixel unit on the front side and a pixel unit on the back side opposite to the pixel unit on the front side are controlled by an identical circuit, and each of the circuits comprises a first switching transistor, a first input terminal of the first switching transistor connected to a scan line, a second input terminal of the first switching transistor connected to a data line, and an output terminal of the first switching transistor connected to the opposite pixel units on the front side and the back side,
   wherein each of the circuit further comprises a third switch transistor; the third switching transistor for switching on the pixel unit on the back side is connected between the output terminal of the first switching transistor and the pixel unit on the back side; the third switching transistor comprises an input terminal electrically connected to the output terminal of the first switching transistor, an output terminal electrically connected to the pixel unit on the back side, and a control terminal connected to a control line.

5. The double-sided display of claim 4, wherein each of the circuit further comprises a second switching transistor; the second switching transistor for switching on the pixel unit on the front side is connected between the output terminal of the first switching transistor and the pixel unit on the front side; the second switching transistor comprises an input terminal electrically connected to the output terminal of the first switching transistor, an output terminal electrically connected to the pixel unit on the front side, and a control terminal connected to the same control line with the control terminal of the third switching transistor.

6. The double-sided display of claim 5, wherein each of the circuit further comprises an inverter; an input of the inverter is connected the control line, and an output of the inverter is connected to one of the control terminal of second switching transistor and the control terminal of third switching transistor.

7. The double-sided display of claim 1, wherein the through holes are respectively filled with electrical connections that are electrically connected between the outputs terminal of the first switching transistors and the pixel units on the back side.

8. The double-sided display of claim 1, wherein the through holes are respectively filled with electrical connections that are electrically connected between the output terminal of the third switching transistors and the pixel units on the back side.

9. The double-sided display of claim 1, wherein the pixel units on the front side are an active light-emitting display units or passive light-emitting display units, the pixel units on the back side are an active light-emitting display units or passive light-emitting display units, and each of the pixel units on the front side and back side comprises a storage capacitor.

10. The double-sided display of claim 9, wherein the pixel units on the front side are active light-emitting display units, each pixel unit on the front side comprises an organic light-emitting diode OLED acting as an active light-emitting display device and a first driving transistor; the first driving transistor comprises a control terminal electrically connected to the output terminal of the first switching transistor, an input terminal electrically connected to a cathode of the organic light-emitting diode OLED, and an output terminal grounded; and wherein the storage capacitor is connected between the control terminal and the output terminal of the first driving transistor, and an anode of the OLED is connected to a power supply line.

11. The double-sided display of claim 9, wherein the pixel units on the back side are active light-emitting display units, each pixel unit on the back side comprises an organic light-emitting diode OLED acting as an active light-emitting display device and a second driving transistor; the second driving transistor comprises a control terminal electrically connected to the output terminal of the first switching transistor, an input terminal electrically connected to a cathode of the organic light-emitting diode OLED, and an output terminal grounded; and wherein the storage capacitor is connected between the control terminal and the output terminal of the second driving transistor, and an anode of the OLED is connected to a power supply line.

12. The double-sided display of claim 10, wherein the second driving transistors and the storage capacitor of the pixel units on the back side are disposed on the front side instead of the back side, and the second driving transistors are respectively connected to the cathodes of the organic light-emitting diode OLEDs via the through holes.

13. The double-sided display of claim 9, wherein each of the passive light-emitting display units comprises electronic ink E-INK acting as a passive light-emitting display device, and the electronic ink E-INK is disposed between two counter electrodes of the storage capacitor;

wherein one of the two counter electrodes of the storage capacitor is electrically connected to the output terminal of the first switching transistor, and the other is grounded.

14. A double-sided display, comprising:
a substrate comprising a first side, a second side opposite to the first side, and a plurality of through holes penetrating through the substrate;
a plurality of first pixel units, each first pixel unit comprising a first light-emitting display device disposed on one of the first and second sides; and
a plurality of second pixel units, each second pixel unit comprising a second light-emitting display device on the other one of the first and second sides, wherein the second light-emitting display devices are opposite to the first light-emitting display devices in a one-to-one manner; and
a plurality of circuits disposed on one of the first and second sides, wherein a first light-emitting display device and a second light-emitting display device opposite to the first light-emitting display device are controlled by an identical circuit, and each of the circuits comprises a first switching transistor, a first input terminal of the first switching transistor connected to a scan line, a second input terminal of the first switching transistor connected to a data line, and an output terminal of the first switching transistor connected to one of the opposite first and second the light-emitting display devices and connected to the other one of the opposite first and second the light-emitting display devices via a corresponding through hole.

15. A method for controlling the double-sided display of claim 5, comprising the following steps:
inputting, through the control line, a control signal for simultaneously switching on the second switching transistor and the third switching transistor, and
simultaneously controlling, by a data signal, the opposite pixel units on the front side and the back side that are respectively electrically connected to the second switching transistor and the third switching transistor to display;
wherein the data signal, after being input from the data line, is transmitted to the pixel unit on the front side and the opposite pixel unit on the back side respectively via the first switching transistor activated by a scan signal input from a scan line.

16. A method for controlling the double-sided display of claim 6, comprising the following steps:
inputting, through the control line, a control signal for switching on the second switching transistor and switching off the third switching transistor, and controlling, by a data signal, the pixel unit on the front side that is electrically connected to the output terminal of the second switching transistor to display, wherein the data signal, after being input from a data line, is transmitted to the pixel unit on the front side via the first switching transistor activated by a scan signal input from a scan line and the second switching transistor T2 in sequence so that only the front side of the double-sided display displays;

or, inputting, through the control line, a control signal for switching off the second switching transistor and switching on the third switching transistor, and controlling, by a data signal, the pixel unit on the back side that is electrically connected to the output terminal of the third switching transistor to display, wherein the data signal, after being input from the data line, is transmitted to the pixel unit on the back side via the first switching transistor activated by a scan signal input from a scan line and the third switching transistor in sequence so that only the back side of the double-sided display displays.

17. A method for controlling the double-sided display of claim 6, comprising the following steps:

inputting, through the control line, a first control signal for switching on the second switching transistor and switching off the third switching transistor, and controlling, by a data signal, the pixel unit on the front side that is electrically connected to the output terminal of the second switching transistor to display, and meanwhile charging the storage capacitor of the pixel unit on the front side by the first data signal until a voltage of the storage capacitor of the pixel unit on the front side reaches a voltage required for maintaining the display of the pixel unit on the front side; and inputting, through the control line, a second control signal for switching off the second switching transistor and switching on the third switching transistor, and controlling, by a second data signal, the pixel unit on the back side that is electrically connected to the output terminal of the third switching transistor to display, and meanwhile charging the storage capacitor of the pixel unit on the back side by the second scan signal until a voltage of the storage capacitor of the pixel unit on the back side reaches a voltage required for maintaining the display of the pixel unit on the back side;

wherein the first data signal, after being input from the data line, is transmitted to the pixel unit on the front side via the first switching transistor activated by a scan signal input from a scan line and the second switching transistor in sequence; and the second data signal, after being input from the data line, is transmitted to the pixel unit on the back side via the first switching transistor activated by a scan signal input from a scan line and the third switching transistor in sequence.

18. The method of claim 17, wherein the first data signal and the second data signal are different image signals and are alternately transmitted to the opposite pixel units on the front side in a time division manner so that the front side and the back side of the double-sided display simultaneously display different images.

* * * * *